United States Patent [19]
Trumpp

[11] Patent Number: 5,889,423
[45] Date of Patent: Mar. 30, 1999

[54] GENERATING CIRCUIT INCLUDING SELECTION BETWEEN PLURAL PHASE REGULATORS

[75] Inventor: Gerhard Trumpp, Puchheim, Germany

[73] Assignee: Siemens Aktiengesellschaft, Munich, Germany

[21] Appl. No.: 776,695
[22] PCT Filed: Aug. 8, 1995
[86] PCT No.: PCT/BE95/01038
§ 371 Date: Feb. 3, 1997
§ 102(e) Date: Feb. 3, 1997
[87] PCT Pub. No.: WO96/05672
PCT Pub. Date: Feb. 22, 1996

[30] Foreign Application Priority Data

Aug. 8, 1994 [DE] Germany .................. 44 27 972.8

[51] Int. Cl.⁶ ............................................... H03K 3/00
[52] U.S. Cl. .......................... 327/298; 327/99; 327/147; 327/161; 327/292; 375/376
[58] Field of Search .................... 327/144–153, 327/99, 291, 292, 293, 294, 297, 298; 375/355, 362, 374, 376

[56] References Cited

U.S. PATENT DOCUMENTS 5,150,068  9/1992  Kawashima et al. .................. 327/149

FOREIGN PATENT DOCUMENTS

B 604997   8/1989   Australia .
0 418 641 A2  3/1991  European Pat. Off. .
0 460 274 A1 12/1991  European Pat. Off. .

OTHER PUBLICATIONS

Patent Abstracts of Japan, vol. 8, No. 149, (E–255), 12 Jul. 1984 and JP59–054344 dated 29 Mar. 1984.

*Primary Examiner*—Kenneth B. Wells
*Attorney, Agent, or Firm*—Hill & Simpson

[57] ABSTRACT

A method and a completely integrable circuit arrangement are proposed for recovery of a timing signal from a data stream. Two groups of phase regulators are supplied with a locally existing reference timing signal, preferably in each case one of mutually complementary reference timing signals. One phase regulator in each case, which has assumed a state within its operating range, is selected to provide the recovered timing signal, while a phase regulator which is currently not selected is kept in the state within its operating range which is diametrically opposite to the state of the currently selected phase regulator. On reaching the limit of the operating range of the currently selected phase regulator, a changeover is made to the phase regulator which has been kept ready until this point.

11 Claims, 8 Drawing Sheets

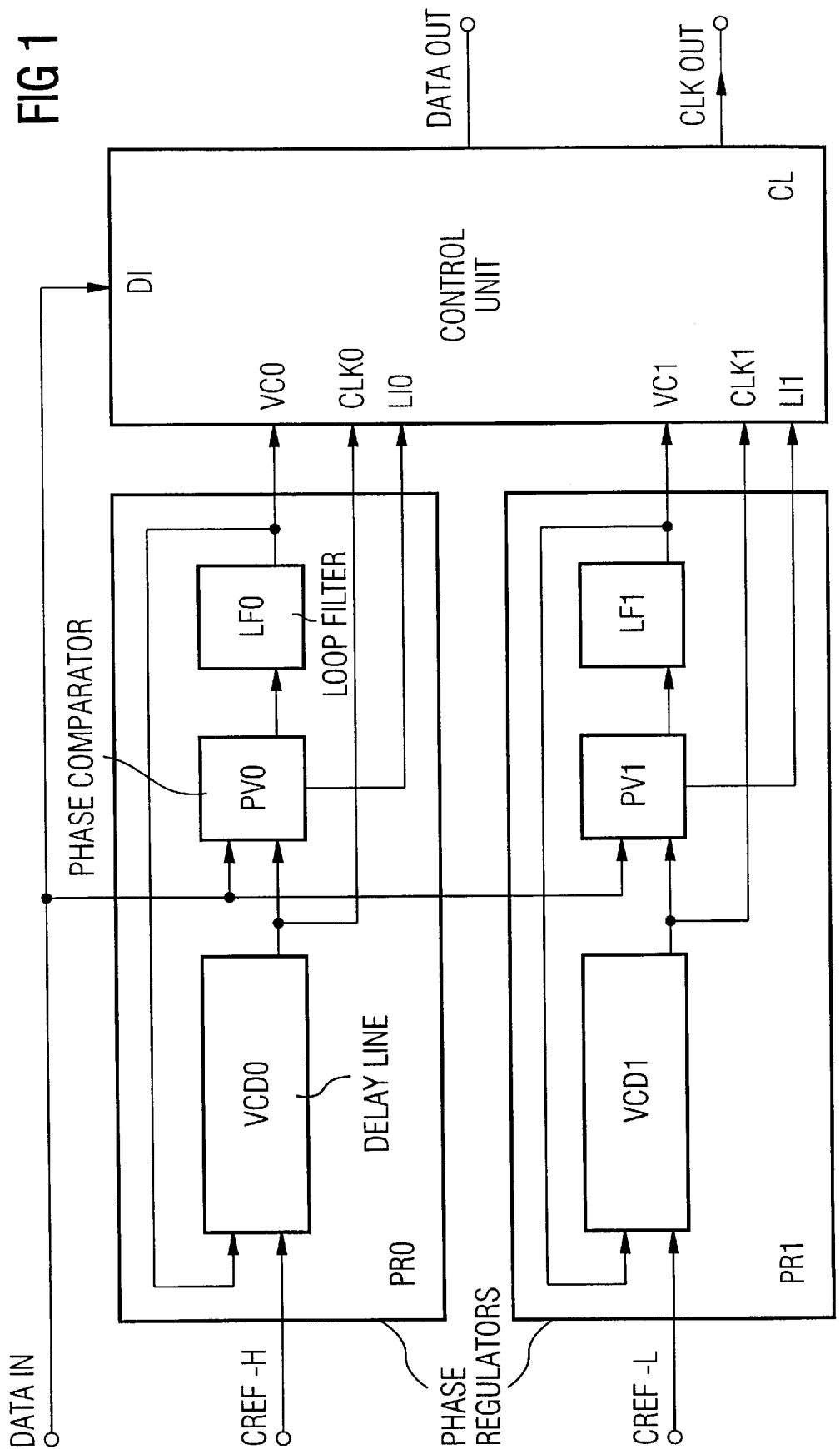

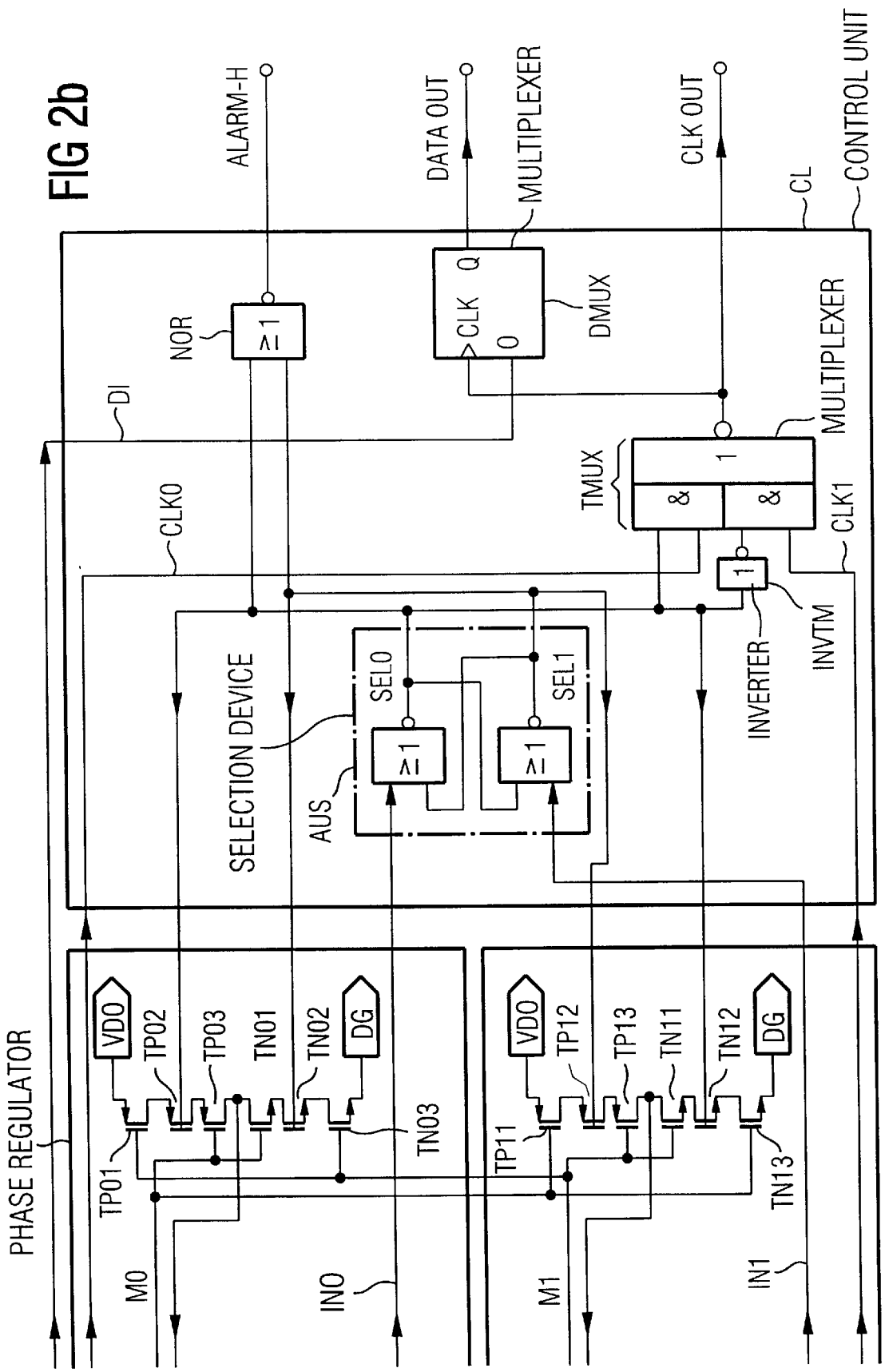

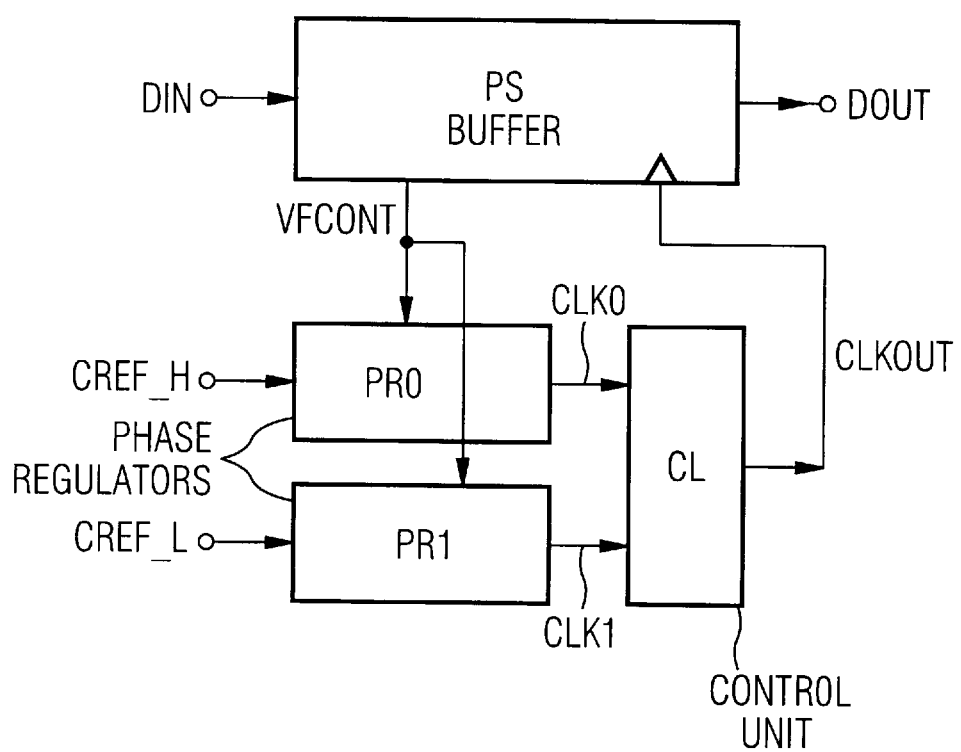

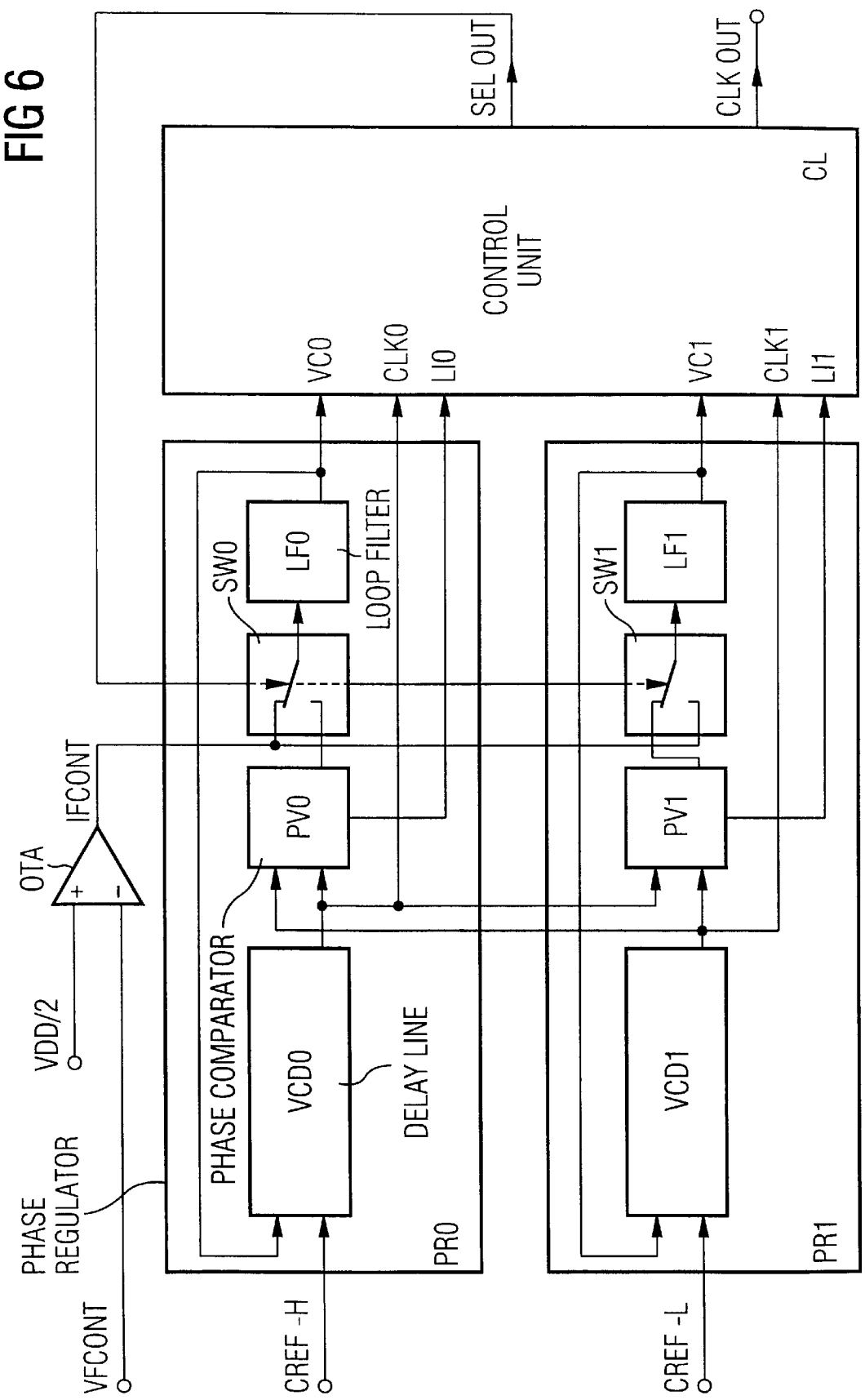

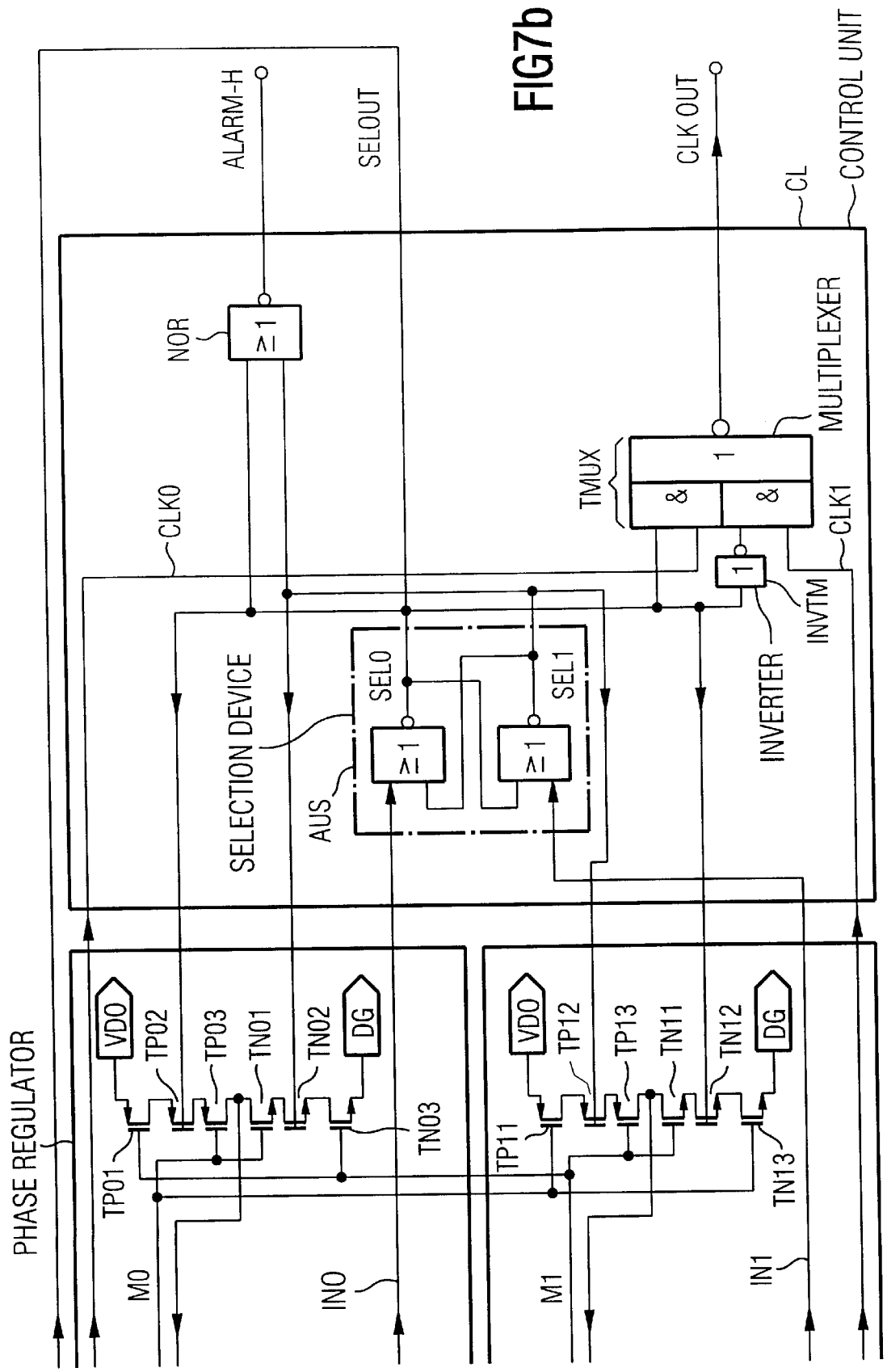

GENERATING CIRCUIT INCLUDING SELECTION BETWEEN PLURAL PHASE REGULATORS

BACKGROUND OF THE INVENTION

The invention relates to a method and a circuit arrangement for obtaining a timing signal.

In digital data transmission systems, the bit timing at the receiving end can be obtained from the received digital data signal by means of clock recovery circuits. When phase locked loops are used for clock recovery from a digital data stream, only pure phase comparators (phase-sensitive phase detectors) may be used since no phase correction flank is available with every bit clock pulse but, depending on the envisaged coding, for example on average only every three bit clock pulses. As is known, these pure phase comparators have the disadvantage that circuits constructed in this way also lock onto harmonic frequencies and even attempt to do this (unsuccessfully) at other frequencies. In order to avoid these disadvantages, voltage-controlled oscillators have been used until now having a mid-frequency which is in each case defined accurately and corresponds to the nominal value of the bit clock rate, as well as a very small frequency shift, precise frequency-determining elements being required to implement such voltage-controlled oscillators (cf. Deutsche Bundespost Information Leaflets, Year 34/1981, No. 2, page 81).

PLL (Phase Locked Loop) circuits are used in digital data transmission networks, for example in SDH (Synchronous Digital Hierarchy) transmission systems, to produce the transmission clock. The phase locked loop compares the filling level of a buffer store with its nominal value, and corrects the transmission frequency accordingly. The nominal transmission frequency is defined by the mid-frequency of the phase locked loop. The actual transmission frequency is determined by pulling the phase locked loop via its control voltage on the basis on the quantity of data which occurs. The signal which indicates the discrepancy between the filling level of the buffer store and the nominal value is provided by a discrete signal having a low rate of state changes in comparison with the transmission frequency. Integrated voltage-controlled oscillators VCOs which are known per se cannot be used for this application because of the occasional correction, since their short-term stability is insufficient by a wide margin in terms of the accuracy requirements for synchronous data networks.

In this application as well, circuits are normally used in which a phase locked loop controls a voltage-controlled, crystal-stabilized oscillator VCXO (Voltage-Controlled Xtal (=crystal) Oscillator). These voltage-controlled, crystal-stabilized oscillators require accurate frequency-determining elements for stabilization.

The frequency-determining elements, which can be provided by narrowband filters or tuned circuits and which can be implemented, for example, using surface acoustic wave, crystal or ceramic filters cannot directly be integrated together with the rest of the circuit in a chip, so that the frequency-determining elements must be arranged outside the chip, for which purpose additional connections to the chip must be provided, additional space is required on the assembly, and additional outlay is required for fitting the assembly with components.

SUMMARY OF THE INVENTION

In digital transmission systems in which a plurality of data signals which are not locked in phase to one another are intended to be received or transmitted simultaneously, the complexity is evident in a particularly disturbing manner since a separate phase locked loop must be provided for each data signal, each phase locked loop having accurate frequency-determining elements. The invention is based on the problem of specifying a method and a circuit arrangement for obtaining a timing signal, in the case of which method and circuit arrangement precise external or trimming frequency-determining elements are avoided.

The essential features for solving the problem are provided in that

- a plurality of phase regulators (PR0, PR1) are provided which each have a controlled delay line (VCD0, VCD1), a phase comparator (PV0, PV1) and a loop filter (LF0, LF1) and whose control voltages can be driven in a control range between an upper limit (UH) and a lower limit (UL)
- a reference timing signal (CREF0, CREF1) is supplied to the inputs of the delay lines of the phase regulators
- a phase regulator is selected whose signal which is emitted on the output side is defined as the timing signal
- the delayed duration of the selected phase regulator is influenced on the basis of a drive signal
- if the currently selected phase regulator is driven to its upper or lower control range limit, a respective different phase regulator can be selected whose control voltage is just not driven to this limit.

The subject matter of the application can be implemented completely on an integrated chip. The subject matter of the application avoids precise frequency-determining components which can be integrated only with difficulty, as a result of which the cost for the frequency-determining components themselves, the cost for the connections which would otherwise have to be provided in addition of the integrated chip, the cost for the installation space for the frequency-determining components on the assembly and the cost which would otherwise be necessary in order to fit the assembly with the frequency-determining components are saved. The subject matter of the invention is in principle superior to conventional clock obtaining devices provided it utilizes a transmission timing signal, which is present locally anyway, as a reference timing signal, since a transmission timing signal is, as a rule, considerably more stable in terms of maintenance of the frequency than the timing signal which is emitted by a voltage-controlled oscillator, as a result of which the timing signal CLKOUT which is emitted by the clock recovery device according to the invention has a more stable frequency over all.

In the application of clock recovery from a data stream having long sequences of identical binary characters using a conventional clock recovery device, frequency discrepancies in the voltage-controlled oscillator can be integrated up to form any random phase differences. In the case of the clock obtaining device according to the invention, any change in the control voltage resulting from the leakage current of the capacitor, which is designed as a loop filter, in this case leads to a phase difference which is limited to a maximum of 180 degrees with respect to the reference timing signal.

BRIEF DESCRIPTION OF THE DRAWINGS

The features of the present invention which are believed to be novel, are set forth with particularity in the appended claims. The invention, together with further objects and advantages, may best be understood by reference to the following description taken in conjunction with the accompanying drawings, in the several Figures of which like reference numerals identify like elements, and in which:

FIG. 1 shows a block diagram of the clock obtaining circuit according to the invention for clock recovery from a data signal;

FIGS. 2a, 2b show further details of the clock obtaining circuit from FIG. 1;

FIG. 5 shows a block diagram of the circuit arrangement according to the invention for obtaining a clock for the transmission of a data signal;

FIG. 6 shows an outline circuit diagram of the block diagram from FIG. 5; and

FIGS. 7a, 7b show further details of the circuit from FIG. 6.

DESCRIPTION OF THE PREFERRED EMBODIMENTS

Figure 2A:
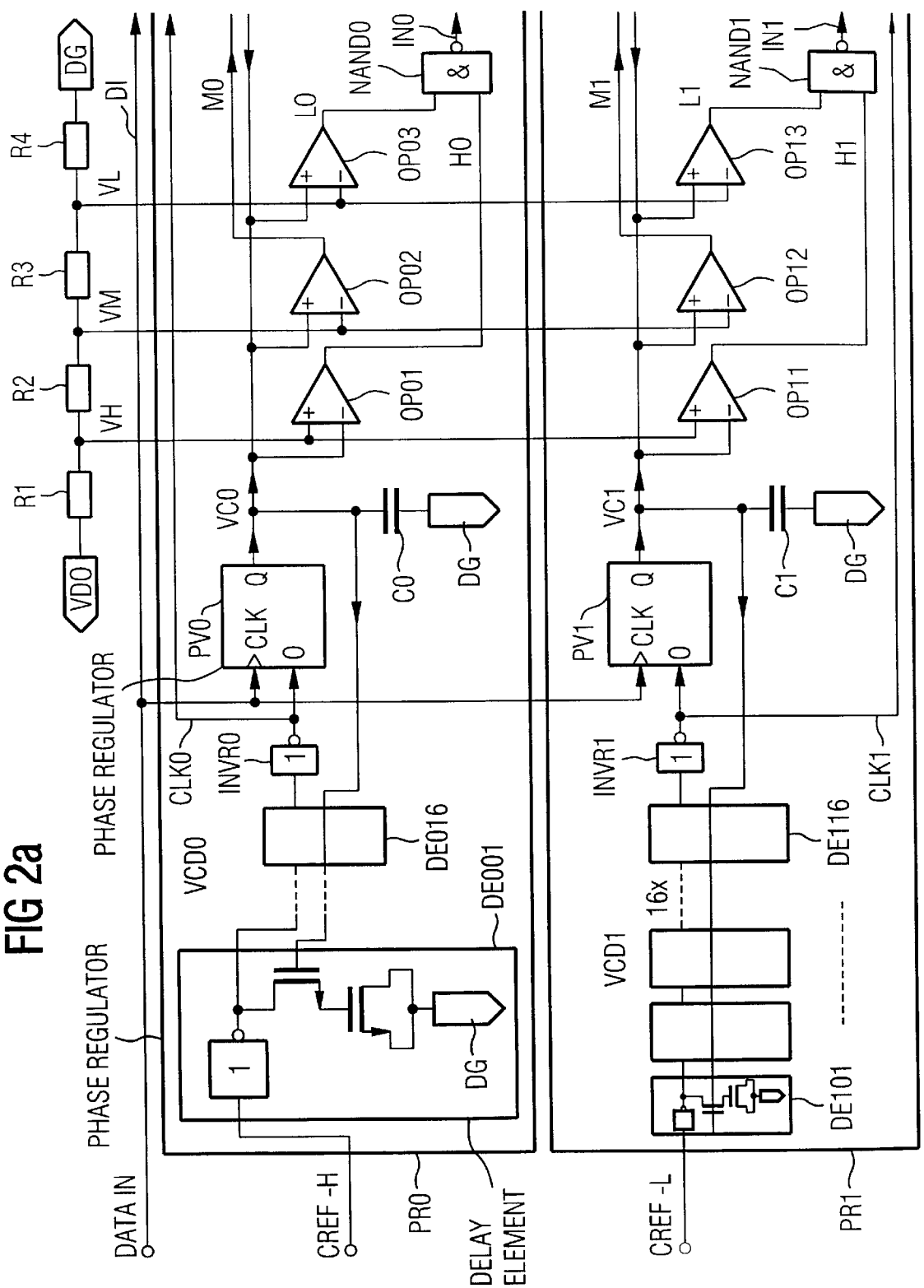

The block diagram in FIG. 1 has two phase regulators PR0, PR1 and a control unit CL (for: Control Logic). A serial data stream is supplied as the input signal to the phase regulators and to the control unit, via a connecting terminal DATAIN. The data stream may comprise binary characters at a predetermined, nominal repetition rate. A reference timing signal CREF, which is approximately at the clock frequency associated with the data stream, is supplied to the phase regulators as a further input signal. The reference timing signal may be provided by a timing signal which is present locally anyway and is required for transmission of a data stream. In a preferred embodiment, mutually complementary reference timing signals CREF H, CREF L are in each case supplied to the phase regulators. The relevant reference timing signal is supplied, in a phase regulator, to a voltage-controlled delay line VCD0, VCD1. The reference timing signal is delayed in the delay line on the basis of a control voltage VC0, VC1 which is supplied. The data stream and the reference timing signal which is emitted from the delay line are supplied as input signals to a phase comparator PV0, PV1. On the basis of the coincidence of the input signals which are supplied to it, the phase comparator delivers an output signal which is supplied to a loop filter LF0, LF1. This output signal is processed, in a manner known per se for phase locked loops, with an integrating effect in the loop filter. The output signal which is emitted from the loop filter is supplied on the one hand to the delay line as a control voltage and on the other hand to the control unit, at its terminal VC0, VC1. In addition to the output signal at terminal VC0, VC1, each phase regulator supplies the terminal CLK0, CLK1 of the control unit with the reference timing signal which has been delayed by the associated delay line, and supplies the terminal LI0, LI1 with an information signal which has been delivered from the phase comparator. This information signal is formed on the basis of the phase discrepancy between the signals which are supplied to the phase comparator. After evaluation of the signals which are supplied to the control unit on the input side, the control unit emits the data stream at the terminal DATAOUT and the timing signal, which is correlated with this data stream, at the terminal CLKOUT. The timing signal which is emitted at the terminal CLKOUT may thus be at a somewhat higher frequency or a somewhat lower frequency, permanently, than the reference timing signal. In order to compensate for the frequency difference between the reference timing signal and the timing signal CLKOUT, the reference timing signal is increasingly phase-shifted in a delay line.

Each of the phase regulators can lock onto the data stream which is supplied to the terminal DATAIN and can compensate for phase differences between the reference timing signal and the data stream by suitably readjusting the delay time of the delay line, until the delay line reaches the limits of its control range. The control unit has the task of continuously selecting a phase regulator which is operating within its control range and, at the same time, of keeping ready a phase regulator which is currently not selected and sets its control range in such a manner that it can take over when the currently selected phase regulator reaches the limit of its control range. For the selection of a phase regulator, on the one hand, and, on the other hand, in order to keep ready a phase regulator, which is currently not selected, with its control range in a suitably set state, the control unit evaluates the control voltages VC0, VC1 for the delay lines and, in addition to this, possibly the information signals which are emitted from the phase comparators. The control unit has a clock multiplexer which switches through to the terminal CLKOUT one of the timing signals which is supplied from the control unit at the terminals CLK0, CLK1. Depending on the nature of the phase comparator in use, the control unit has a sampling flipflop for sampling the data signal with the recovered timing signal. If a phase comparator according to Hogge, which is known from the literature reference T. H. LEE, J. F. Bulzacchelli, "A 155-MHz Clock Recovery Delay- and Phase- Locked loop", IEEE J. of Silid-State-circuits, Vol 27, No. 12, December 1992, pp. 1736–1745 is used, the control unit has a data multiplexer.

FIG. 2 shows a simple embodiment of a circuit arrangement, which is implemented using CMOS (Complementary Metal Oxide Silicon) technology, at component level. The delay lines are in each case formed by 16 delay elements DE001 . . . DE016, and DE101 . . . DE116 (for: Delay Element). Each delay element is formed using an invertor which is loaded on the output side via a controllable resistor with a load capacitance. The two connections of the load path of the controllable resistor are provided by the two main electrodes of a first N-channel field-effect transistor, the control voltage being applied to the control electrode of the field-effect transistor. The load capacitance is formed by the capacitance between the control electrode and the load path of a second N-channel field-effect transistor, the control electrode of the second field-effect transistor being connected to the source electrode of the first field-effect transistor, and the two main electrodes of the second field-effect transistor being connected to the terminal DG, which carries the low potential, of an operating voltage source VDD–DG, which is not illustrated in more detail. The output of a delay element is provided by the output of an invertor which is loaded with a controlled load capacitance. The output of a delay element is connected to the input of the respectively next delay element; the output of the last delay element of the delay line is connected to an invertor INVR0, INVR1 for regeneration of the pulse waveform. The output of the invertor INVR0, INVR1 which is under consideration is connected to the D input of a D flipflop DFF0, DFF1 which forms the relevant phase comparator PV0, PV1. The data stream is supplied to the input CLK of the D flipflop. The instantaneous state of the delayed reference timing signal is transferred to the output of the D flipflop on each rising flank of the data stream. In this exemplary embodiment, the loop filter is formed by a capacitor C0, C1 which is connected on one side to the output of the phase comparator and on the other side to the terminal DG, which carries the low potential, of the operating voltage source VDD–DG. The capacitor C0, C1 integrates the output current delivered from the associated phase comparator. The voltage across the capacitor C0, C1 is supplied to all the delay elements of the associated delay line. In applications having a small number of state changes in the data stream with respect to a time period under consideration, other loop filters may be used instead of the capacitor C0, C1, for example the loop filters which are known from R. Best "Theorie und Anwendung des Phase-locked Loops" (Theory and Application of the phase-locked loop") AT Press Aarau—Stuttgart ISBN 3-85502-123-6. The delay line, the phase comparator and the loop filter form a phase locked loop, the phase comparator regulating such that a rising flank in the data stream coincides with the rising flank of the delayed reference timing signal.

The control voltage for each phase regulator is monitored to determine whether its value is above or below a high voltage UH, a medium voltage UM or a low voltage UL. A voltage divider which is formed by four resistors R1, R2, R3 and R4 is connected to the two terminals of the operating voltage source VDD–DG. The voltage divider provides the high voltage UH, the medium voltage UM and the low voltage UL. Three differential amplifiers OP01, OP02, OP03, and OP11, OP12, OP13 are assigned to each phase regulator. The differential amplifiers OP01 and OP11 have the high voltage UH applied to their non-inverting input (+), and the associated control voltage VC0, VC1 applied to their inverting input (−). The differential amplifiers OP02 and OP12 have the medium voltage UM applied to their inverting input (−), and the associated control voltage VC0, VC1 applied to their non-inverting input (+). The differential amplifiers OP03 and OP13 have the low voltage UL applied to their inverting input (−) and the associated control voltage VC0, VC1 applied to their non-inverting input (+). The output signals H0, L0 and H1, L1, respectively, which are emitted from the differential amplifiers OP01 and OP03, and OP11 and OP13, respectively, are supplied to the inputs of a NAND gate NAND0 or NAND1, respectively, which gates implement the logic NAND function. The differential amplifiers OP01 and OP03, and OP11 and OP13, respectively, together with the NAND gates NAND0 and NAND1, respectively, form a window comparator, the Nand gate NAND0 or NAND1, respectively, then emitting at its output a signal IN0, IN1 at low level (LOW) when the control voltage is less than the high voltage UH and higher than the low voltage UL. A signal IN0, IN1 at low level (LOW) thus indicates that the associated phase regulator is in a state within its control range while, in contrast, a signal IN0, IN1 at high level (HIGH) indicates that the associated phase regulator has assumed a state outside its control range. The voltage UH and the voltage UL thus form the limits of a defined control range.

The signals IN0 and IN1 which are emitted from the window comparators are supplied to a selection device AUS. For the situation in which an indication occurs that the control range of the currently selected phase regulator will be left by the associated signal IN0, IN1 at high level (HIGH), the selection device selects another phase regulator which has assumed a state within its control range. The selection device in the exemplary embodiment is formed by two NOR gates which implement the logic NOR function and are wired up to form an RS flipflop in a manner known per se. The selection device may thus assume the states of an RS flipflop at its outputs SEL0, SEL1 (for: SELECT).

A clock multiplexer TMUX is controlled on the basis of the signal state at the output SEL0 of the selection device. The clock multiplexer is formed by two AND gates which implement the logic AND function and whose outputs are linked via a NOR gate which implements the logic NOR function. The AND gates are in each case supplied on the one hand with the reference timing signals CLK0, CLK1 which have been delayed by the delay lines and, on the other hand, with the signal state at the output SEL0 of the selection device or with the state of this signal state after inversion via an invertor INVTM. Thus, if there is a high signal state at the output SEL0 of the selection device, the clock multiplexer switches the reference timing signal CLK0, which has been delayed by the delay line VCD0, through in inverted form to the terminal CLKOUT of the control unit, while in contrast, if the signal state at the output SEL0 of the selection device is low, the reference timing signal CLK1, which has been delayed by the delay line VCD1, is switched through in inverted form to the terminal CLKOUT. As a result of the inversion in the clock multiplexer, the timing signal appears at the terminal CLKOUT shifted by one half clock cycle with respect to the timing signal at the input of the currently selected phase comparator. A data multiplexer DMUX is formed by a D flipflop, the data stream DATAIN being supplied to the D input, and the timing signal at the terminal CLKOUT being supplied to the CLK input. The data stream is clocked off in the middle of a subsequent bit transmission time interval with each rising flank of the timing signal at the terminal CLKOUT.

A series circuit of three p-channel field-effect transistors TP01, TP02, TP03 and TP11, TP12, TP13 arranged in series and three n-channel field-effect transistors TN01, TN02, TN03 and TN11, TN12, TN13 arranged in series is provided for each phase regulator. The source electrode of the p-channel field-effect transistor TP01 or TP11 located on the outside is connected to the terminal VDD which is carrying the high potential, and the source electrode of the n-channel field-effect transistor TN03 or TN13 which is located on the outside is connected to the terminal DG, which is carrying the low potential, of the operating voltage source. The center tapper of the series circuit is connected to the associated control voltage.

The differential amplifier OP02 or OP12, respectively, emits at its output a signal at high level (HIGH) when the associated control voltage is higher than the medium voltage UM. The output of the differential amplifier OP02 or OP12, respectively, is connected to the control electrodes of the field-effect transistors TP03 and TN01, and TP13 and TN11, respectively, of the associated series circuit, as well as to the control electrodes of the field-effect transistors TP11 and TN13, and TP01 and TN03, respectively, of the series circuit which is associated with a respective other phase regulator. The output SEL0 of the selection device is connected to the control electrodes of the field-effect transistors TP02 and TN12. The output SEL1 of the selection device is connected to the control electrodes of the field-effect transistors TN02 and TP12. If the phase regulator PR0 is now selected by a signal at high level at the output SEL0 of the selection device, then the field-effect transistors TP02 and TN02 are switched off, and the field-effect transistors TP12 and TN12 are switched on. The series circuit of the currently selected phase regulator is thus switched off, as a result of which it has no influence on the associated control voltage. The series circuit of a phase regulator which is currently not selected is switched on in such a manner that the magnitude of the control voltage of this phase regulator is in each case influenced in the direction of the other side of the control range, with respect to the medium voltage UM than the side of the control range in which the instantaneous magnitude of the control voltage of the currently selected phase regulator falls. This influence continues until the control voltage has exceeded the medium voltage and, as a result of the state of change of the output of the differential amplifier OP02 or OP12, respectively, of the phase regulator which is currently not selected, the associated series circuit is switched off in terms of influencing the control voltage any further. If the control voltage of a phases regulator which is currently not selected has a magnitude which already falls on the other side of the control range, with respect to the medium voltage UM, than the side of the control range in which the instantaneous magnitude of the control voltage of the currently selected phase regulator falls, then the series circuit of the phase regulator which is currently not selected remains switched off, as a result of which the associated control voltage is not influenced.

For the situation in which the control voltages of all the phase regulators have assumed a state outside their control range, all the signals IN0, IN1 which are supplied to the selection device are at high level (HIGH), as a result of which the selection device assumes a low level (LOW) at its outputs SEL0, SEL1. This is evaluated by a NOR gate which implements the logic NOR function, and is indicated by a signal at high level (HIGH) at the terminal ALARM.

Figure 3:
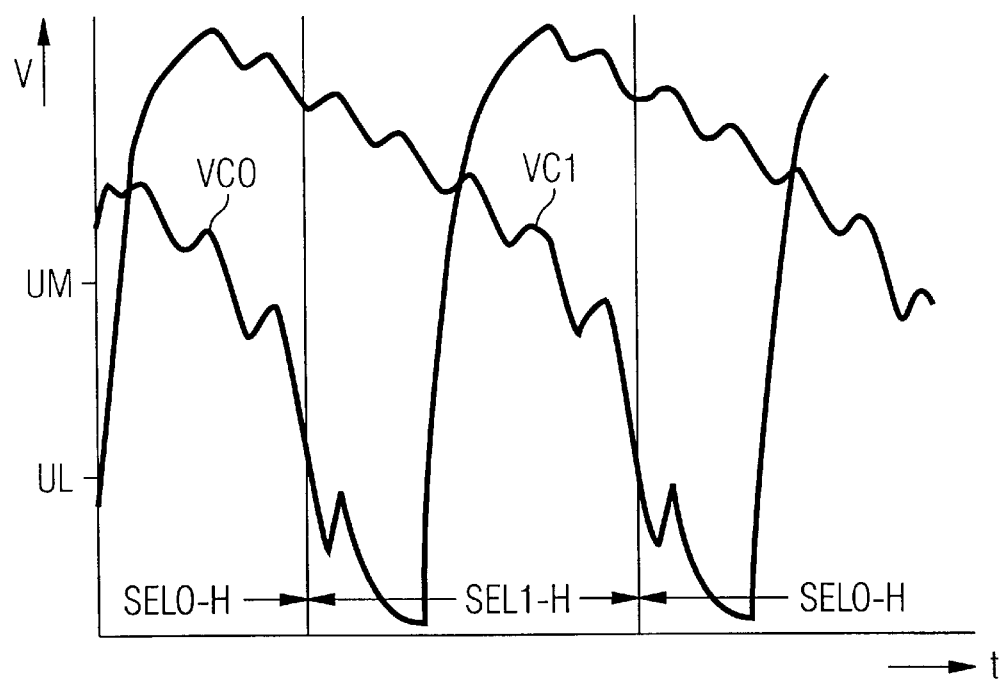
FIG. 3 and FIG. 4 show typical signal waveforms in the clock obtaining circuit when the ratio of the reference timing signal to the timing signal contained in the data stream is greater than 1 and less than 1, respectively.
Figure 4:
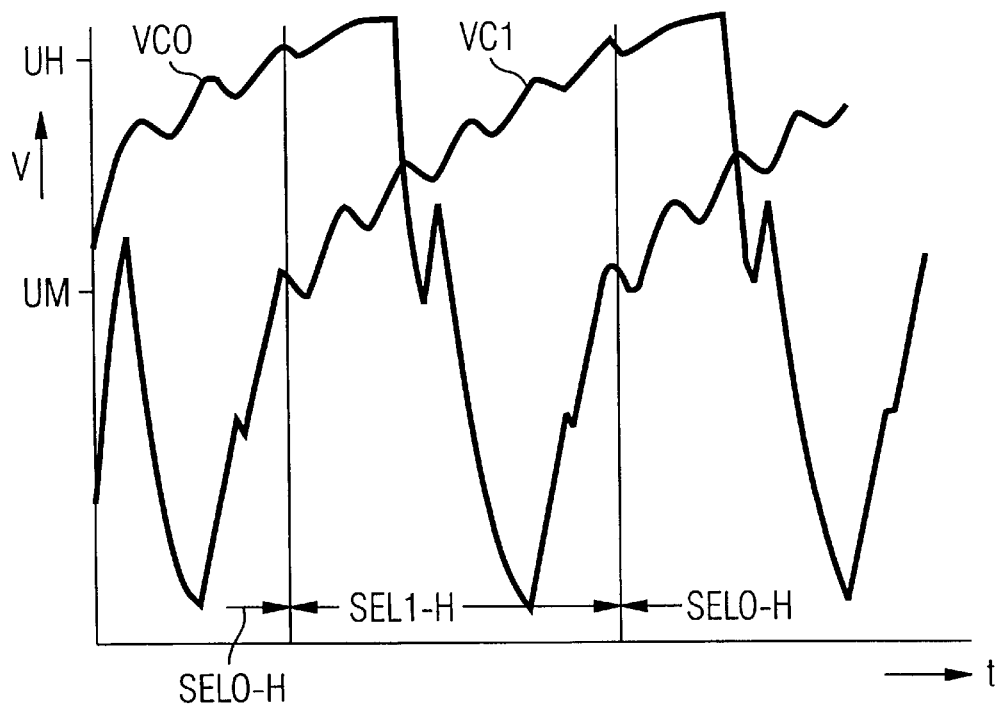

FIG. 3 and FIG. 4 show waveforms of the control voltages VC0, VC1 obtained in the course of a circuit simulation, and the waveforms of the signals SEL0, SEL1 which are present at the outputs of the selection device. The discrepancy between the bit repetition rate of the data stream and the clock rate of the reference timing signal is 1 per thousand in both cases.

In FIG. 3, the bit repetition rate of the data stream is higher than the clock rate of the reference timing signal, as a result of which the currently selected phase regulator continuously reduces the delay of the reference timing signal, while the phase regulator which is currently not selected is held ready in the instantaneous state with a long delay.

In FIG. 4, the bit repetition rate of the data stream is lower than the clock rate of the reference timing signal, as a result of which the currently selected phase regulator continuously increases the delay of the reference timing signal, while the phase regulator which is currently not selected is held ready in the instantaneous state with a short delay.

The illustrations in FIG. 3 and FIG. 4 are based on a phase-modulated data stream with a modulation frequency of 2 MHz.

The phase modulation causes disturbances in the waveform of the control voltages, which can be seen well by the rippled waveform of the control voltages.

FIG. 5 shows a circuit arrangement for transmitting a data signal in a digital transmission system. The data signal is supplied to the input DIN of a buffer store PS. Two phase regulators PR0, PR1 are supplied on the input side with in each case one of mutually complementary reference timing signals CREF H, CREF L. The control unit CL selects a phase regulator whose timing signal CLK0, CLK1, which is emitted on the output side, is used as the timing signal CLKOUT for transmission of the data signal at the output DOUT of the buffer store onto a cable. The frequency of the timing signal which is emitted from the selected phase regulator is influenced by the filling level signal VFCONT which is emitted from the buffer store.

The block diagram in FIG. 6 has two phase regulators PR0, PR1 and one control unit CL (for: Control Logic). A reference timing signal CREF at a given frequency, which is stable to a high level, is supplied as the input signal to the phase regulators. The reference timing signal can be provided by a timing signal which is present locally in any case.

Mutually complementary reference timing signals CREF H, CREF L are in each case supplied to the phase regulators. The relevant reference timing signal in a phase regulator is supplied to a voltage-controlled delay line VCD0, VCD1. The reference timing signal is delayed in the delay line on the basis of a control voltage VC0, VC1 which is supplied. The timing signal which is emitted from the delay line and the timing signal which is emitted from the delay line of another phase regulator are supplied as input signals to a phase comparator PV0, PV1. The phase comparator supplies a current as the output signal, on the basis of the coincidence of the input signals which are supplied to it. The current which is delivered from the phase comparator is supplied to a first input of a controlled changeover switch SW0, SW1. The current IFCONT, which is delivered from a voltage/current converter OTA (for: Operational Transconductance Amplifier) is supplied to the second input of all the controlled changeover switches. The non-inverting input of the voltage/current converter is connected to the medium potential UDD/2 of an operating voltage source which is not illustrated in more detail and has the potentials UDD, DG available at its two terminals. A voltage signal VFCONT is supplied to the inverting input of the voltage/current converter. The voltage/current converter converts the voltage signal VFCONT into a correspondingly high positive or negative current. The voltage signal VFCONT may be provided by a discrete signal which indicates the discrepancy between the filling level of a buffer store and the nominal value. The rate of the state change of the voltage signal VFCONT may be small in comparison to the frequency of the reference timing signal. The signal which is supplied on the output side from the controlled changeover switch is supplied to a loop filter LF0, LF1. In the loop filter, the signal which is supplied is subjected to processing which is known per se for phase locked loops and has an integrating effect. In the present case, a constant magnitude current which is supplied from the phase comparator or the voltage/current converter is converted in the loop filter into a linear-rising voltage signal. The voltage signal which is emitted from the loop filter is supplied on the one hand to the delay line as the control voltage VC0, VC1 and on the other hand to the control unit via connections having the same designations. The control unit emits a timing signal at the terminal CLKOUT subject to evaluation of the signals which are supplied to it on the input side, which timing signal may be at a lower, the same or a higher clock frequency than the reference timing signal CREF. The timing signal which is emitted at the terminal CLKOUT may thus be continuously at a somewhat higher or a somewhat lower frequency than the reference timing signal. In order to compensate for the frequency difference between the reference timing signal and the timing signal CLKOUT, the reference timing signal is increasingly phase-shifted in a delay line. The timing signal which is emitted at the terminal CLKOUT is supplied to the buffer store, whose contents are read out at the frequency of the timing signal.

The control unit always selects a phase regulator whose timing signal is switched through to the terminal CLKOUT. The phase regulator PR1 is illustrated as the selected phase regulator in FIG. 6 and FIG. 7. In the case of a selected phase regulator, the output signal of the voltage/current converter is supplied via the controlled changeover switch SW to the associated loop filter. The frequency of the timing signal which is emitted from the selected phase regulator is thus controlled on the basis of the voltage signal VFCONT which is supplied to the voltage/current converter. In FIG. 6 and FIG. 7, the phase regulator PR 2 is illustrated as the phase regulator which is currently not selected.

In the case of a phase regulator which is not selected, the phase locked loop is closed via the controlled changeover switch, the phase locked loop locking onto the frequency of the instantaneously selected phase regulator. The locking of the phase regulator which is not selected onto the frequency of the selected phase regulator makes a changeover possible without any jump in phase. Since the two phase regulators have mutually complementary reference timing signals applied to them on the input side, the selected phase regulator and the phase regulator which is not selected in general have control voltages VC0, VC1 which differ from one another.

In other respects, that which has been said for the control unit in FIG. 1 applies in a corresponding manner to the control unit in FIG. 6, with the following addition. The control unit emits a signal SELOUT, which changes its state with the selection state of the control unit and produces a changeover of the controlled changeover switches.

Figure 7A:
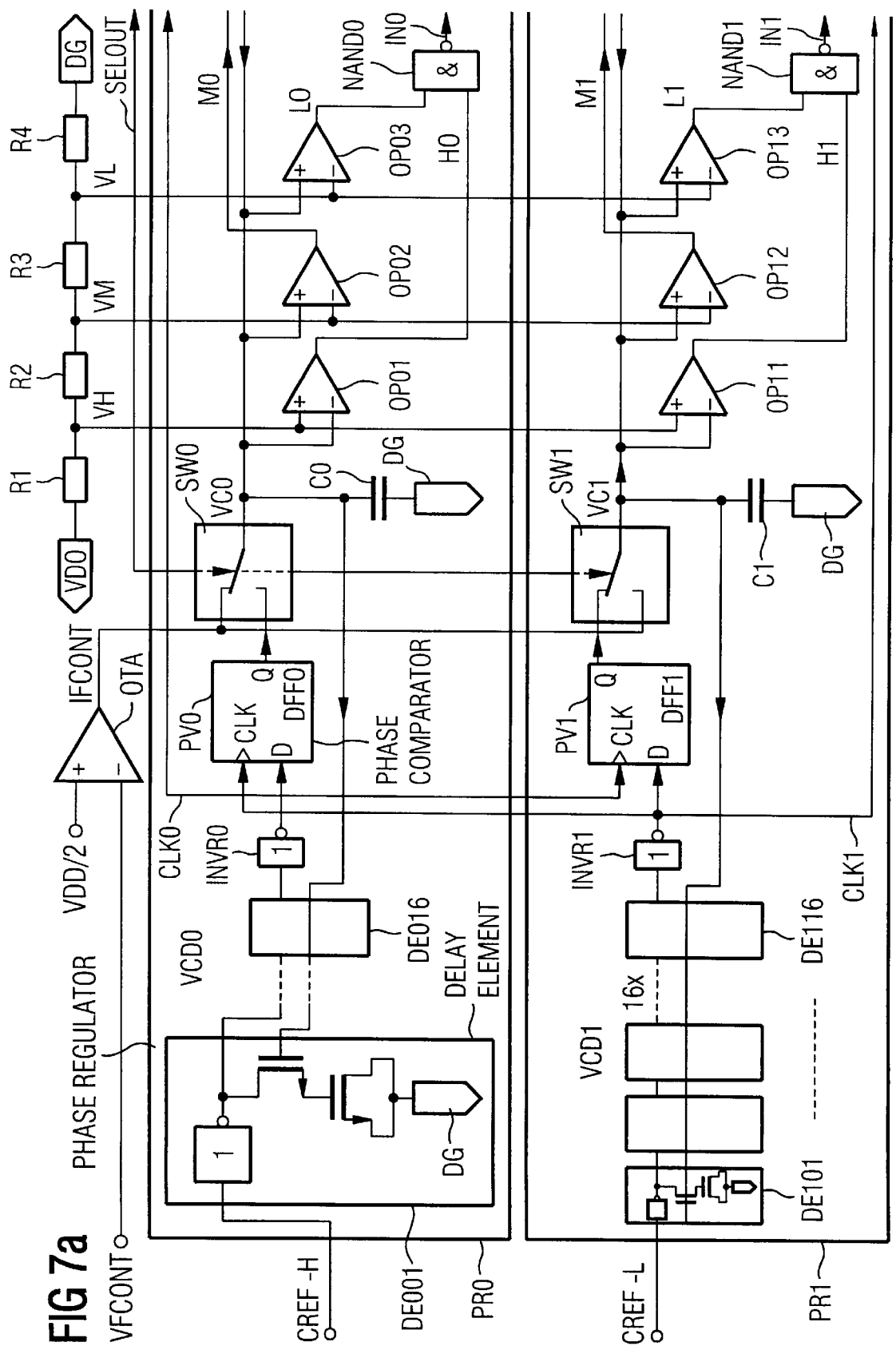

That which has been said for FIGS. 2a, 2b applies to FIGS. 7a, 7b with the following differences. The timing signal which is emitted from the delay line of the respectively other phase regulator is supplied to the input CLK of the D flipflop (DFF0, DFF1). The instantaneous state of the associated timing signal of the output of D flipflop is transferred with each rising flank of the timing signal which is emitted from the respectively other phase regulator. The output of the phase comparator is supplied to an input of a controlled changeover switch, which may be implemented in a manner known per se using transistor switches. The signal at the output of the phase comparator of the instantaneously selected phase regulator is not used. The output current of the phase comparator of the phase regulator which is instantaneously not selected is supplied via the associated controlled changeover switch to the loop filter which is formed by a capacitor C0, C1 and is integrated there. The voltage across the capacitor C0, C1 is supplied to all the delay elements of the associated delay line. In the case of the phase regulator which is instantaneously not selected, the delay line, the phase comparator and the loop filter form a closed control loop via the controlled changeover switch, the phase comparator regulating such that the rising flanks of the timing signal CLK0 and of the timing signal CLK1 at its input are synchronous.

The signal which is emitted at the output SEL0 of the selection device is supplied as the changeover signal SELOUT to the controlled changeover switches SW0, SW1.

The control unit forces the control voltage of a phase regulator which is instantaneously not selected in an operating range which, with respect to the medium voltage, is diametrically opposite to the operating range of the currently selected phase regulator, so that the phase regulator which is instantaneously not selected can lock in only in this state.

The influence of disturbance at terminals of the operating voltage source becomes smaller the shorter the delay time is in a delay line. In one preferred embodiment, the phase regulators are split into two groups, mutually complementary reference timing signals being supplied to each of the groups. In addition to reducing the influence of disturbances caused by disturbances at the terminals of the operating voltage source, this measure makes it possible to operate from shorter, and thus cheaper, delay lines. The delay line is then designed such that it needs to and may compensate for only half the cycle of the timing signal.

The invention is not limited to the particular details of the method and apparatus depicted and other modifications and applications are contemplated. Certain other changes may be made in the above described method and apparatus without departing from the true spirit and scope of the invention herein involved. It is intended, therefore, that the subject matter in the above depiction shall be interpreted as illustrative and not in a limiting sense.

What is claimed is:

1. A method for obtaining a clock signal in a circuit arrangement having a plurality of phase regulators each of the phase regulators having a delay line, a phase comparator and a loop filter, and the phase regulators having control voltages that are driven in a control range between an upper limit and a lower limit, comprising the steps of:

supplying a reference timing signal on an input side to the delay lines of the phase regulators;

selecting a phase regulator from the plurality of phase regulators having an output signal which is emitted on an output side and is defined as the clock signal;

influencing a delay duration of the selected phase regulator based on a drive signal;

selecting, if the currently selected phase regulator is driven to one of an upper or lower control range limit thereof, a respective different phase regulator from the plurality of phase regulators whose control voltage is not driven to the other of said upper or lower control range limit.

2. The method as claimed in claim 1, wherein a data signal is supplied as the drive signal to the phase comparator of the selected phase regulator, and wherein the signal which is emitted on the output side from the selected phase regulator forms the clock signal, with the data signal being associated with the clock signal.

3. The method as claimed in claim 1, wherein a filling level signal of a buffer store is supplied to the loop filter of the selected phase regulator as the drive signal, and wherein the signal which is emitted on the output side from the selected phase regulator forms the clock signal for reading from the buffer store.

4. The method as claimed in claim 1, wherein the phase regulator which has currently not been selected is kept ready and is substantially locked in to a respective other limit like that of the currently selected phase regulator.

5. The method as claimed in claim 1, wherein the phase regulators are split into two groups and wherein a respective one of mutually complementary reference timing signals is supplied to each of the groups.

6. A circuit arrangement for obtaining a clock signal comprising:

a plurality of phase regulators, each of the phase regulators having a controlled delay line connected to a phase comparator and to a loop filter, control voltages for the phase regulators being driven in a control range between an upper limit and a lower limit;

a reference timing signal that is supplied to inputs of the delay lines of the phase regulators;

a selected phase regulator of the plurality of phase regulators providing an output signal, which is emitted on an output side thereof, and which is defined as the clock signal;

a delayed duration of the selected phase regulator being influenced based on a drive signal;

selecting circuitry for selecting, if the currently selected phase regulator is driven to its upper or lower control range limit, a respective different phase regulator whose control voltage is not driven to the other of said upper or lower control range limit.

7. The circuit arrangement as claimed in claim 6, wherein a data signal is supplied as the drive signal to one input of the phase comparator of the selected phase regulator, and wherein the signal which is emitted on the output side from the delay line of the selected phase regulator forms the clock signal, the data signal being associated with the clock signal.

8. The circuit arrangement as claimed in claim 6, wherein a filling level signal of a buffer store is supplied to the input of a loop filter of the selected phase regulator as the drive signal, and wherein the signal which is emitted at the output of the selected phase regulator forms the clock signal for reading from the buffer store.

9. The circuit arrangement as claimed in claim 6, wherein a further phase regulator of the plurality of phase regulators, which is currently not selected, is kept in a locked-in state of a drive on a respectively other side with respect to a center of the control range like the currently selected phase regulator.

10. The circuit arrangement as claimed in claim 6, wherein phase regulators are split into two groups, and wherein a respective one of mutually complementary reference timing signals is supplied to the delay lines of each group of phase regulators.

11. The circuit arrangement as claimed in claim 6, wherein a locally existing clock signal is supplied to the circuit arrangement, in order to transmit a data stream as the reference timing signal.

* * * * *